United States Patent [10] Patent No.: US 12,547,023 B2
Kinoshita et al. [45] Date of Patent: Feb. 10, 2026

(54) ELECTRONIC DEVICE, ELECTRONIC COMPONENT, CONTACT LENS-TYPE ELECTRONIC DEVICE, AND METHOD FOR MANUFACTURING ELECTRONIC DEVICE

(71) Applicant: SEED CO., LTD., Tokyo (JP)

(72) Inventors: Taku Kinoshita, Tokyo (JP); Manabu Furuya, Tokyo (JP)

(73) Assignee: Seed Co., Ltd., Tokyo (JP)

( * ) Notice: Subject to any disclaimer, the term of this patent is extended or adjusted under 35 U.S.C. 154(b) by 669 days.

(21) Appl. No.: 17/912,586

(22) PCT Filed: Jan. 25, 2021

(86) PCT No.: PCT/JP2021/002465
§ 371 (c)(1),
(2) Date: Sep. 19, 2022

(87) PCT Pub. No.: WO2021/192571
PCT Pub. Date: Sep. 30, 2021

(65) Prior Publication Data
US 2023/0314842 A1 Oct. 5, 2023

(30) Foreign Application Priority Data
Mar. 26, 2020 (JP) .................. 2020-056249

(51) Int. Cl.
*H05K 1/02* (2006.01)
*G02C 7/04* (2006.01)
*G02C 11/00* (2006.01)
*H05K 3/00* (2006.01)

(52) U.S. Cl.
CPC ............. *G02C 11/10* (2013.01); *G02C 7/04* (2013.01); *H05K 1/028* (2013.01); *H05K 3/0011* (2013.01); *H05K 2201/09063* (2013.01)

(58) Field of Classification Search
CPC ..... H05K 1/028; H05K 1/0278; H05K 3/0011
See application file for complete search history.

(56) References Cited

U.S. PATENT DOCUMENTS

| 9,696,564 B1 | 7/2017 | Etzkorn et al. |
| 2010/0072643 A1 | 3/2010 | Pugh et al. |
| 2013/0135578 A1* | 5/2013 | Pugh ....................... G02C 7/04 351/159.39 |

(Continued)

FOREIGN PATENT DOCUMENTS

| EP | 2 412 305 A1 | 2/2012 |
| EP | 2979622 A1 | 2/2016 |

(Continued)

OTHER PUBLICATIONS

Office Action (Decision to Grant a Patent) issued Dec. 24, 2024, by the Japan Patent Office in corresponding Japanese Patent Application No. 2022-509321 and an English translation of the Office Action. (3 pages).

(Continued)

*Primary Examiner* — Jeremy C Norris
(74) *Attorney, Agent, or Firm* — Buchanan Ingersoll & Rooney PC

(57) ABSTRACT

An electronic device including a plurality of devices, wiring electrically connecting each of the devices, and a substrate on which the wiring is formed and a slit is formed.

15 Claims, 17 Drawing Sheets

(56) References Cited

U.S. PATENT DOCUMENTS

| | | | |
|---|---|---|---|
| 2014/0005514 A1 | 1/2014 | Pugh et al. | |
| 2014/0321126 A1* | 10/2014 | Narag | F21V 21/14 362/306 |
| 2015/0173602 A1 | 6/2015 | Barrows et al. | |
| 2015/0173658 A1 | 6/2015 | Liu et al. | |
| 2015/0282296 A1* | 10/2015 | Ogura | H05K 1/038 29/850 |
| 2016/0274377 A1 | 9/2016 | Toner et al. | |

FOREIGN PATENT DOCUMENTS

| | | | |
|---|---|---|---|
| JP | 2015-525619 | A | 9/2015 |
| JP | 2015198102 | A | 11/2015 |
| JP | 2016540569 | A | 12/2016 |
| WO | 2014/184137 | A1 | 11/2014 |
| WO | 2019/081903 | A1 | 5/2019 |

OTHER PUBLICATIONS

International Search Report and Written Opinion for International Application No. PCT/JP2021/002465, dated Apr. 13, 2021, 5 pages.
The Extended European Search Report issued Mar. 18, 2024, by the European Patent Office in corresponding European Patent Application No. 21 776 130.3. (9 pages).
Office Action (Communication pursuant to Article 94(3) EPC) issued Sep. 24, 2025, by the European Patent Office in corresponding European Patent Application No. 21 776 130.3-1001. (6 pages).

* cited by examiner

ELECTRONIC DEVICE, ELECTRONIC COMPONENT, CONTACT LENS-TYPE ELECTRONIC DEVICE, AND METHOD FOR MANUFACTURING ELECTRONIC DEVICE

CROSS REFERENCE TO RELATED APPLICATIONS

This is the U.S. National Phase application of PCT/JP2021/002465, filed Jan. 25, 2021, which claims priority to Japanese Patent Application No. 2020-056249, filed Mar. 26, 2020, the disclosures of these applications being incorporated herein by reference in their entireties for all purposes.

FIELD OF THE INVENTION

The present invention relates to an electronic device, an electronic component, a contact lens-type electronic device, and a method for manufacturing an electronic device.

BACKGROUND OF THE INVENTION

Conventionally, a flexible printed circuit (FPC) substrate having flexibility is used for an electronic device.

Moreover, Patent Literature 1 discloses an electronic device in which a substrate formed in a flat shape is bent to follow a spherical contact lens.

PATENT LITERATURE

Patent Literature 1: Japanese Unexamined Patent Application Publication No. 2016-540569

SUMMARY OF THE INVENTION

However, when a substrate formed in a flat shape is bent to follow any curved surface that is not a developable surface (cylindrical surface, conical surface, and tangent surface) such as a spherical surface, a pleated structure is formed and the wiring formed on the substrate is bent, thereby deteriorating the reliability of the electronic device. Consequently, an electronic device capable of preventing deterioration in reliability, when a substrate is bent to follow any curved surface has been in demand.

Aspects of the present invention have been made in view of the above, and an object according to aspects of the present invention is to provide an electronic device, an electronic component, a contact lens-type electronic device, and a method for manufacturing an electronic device capable of preventing deterioration in reliability, when a substrate is bent to follow any curved surface.

To solve the problem described above and to achieve the object, an electronic device according to one aspect of the present invention includes: a plurality of devices; wiring electrically connecting each of the devices; and a substrate on which the wiring is formed and a slit is formed.

In the electronic device according to one aspect of the present invention, the substrate is bent to follow a predetermined curved surface.

In the electronic device according to one aspect of the present invention, the slit is formed so as to extend in a direction substantially orthogonal to a gradient vector with respect to a predetermined direction at each point on the predetermined curved surface.

In the electronic device according to one aspect of the present invention, the slit is formed so as to extend in a direction substantially orthogonal to the gradient vector at a position where magnitude of the gradient vector is large.

In the electronic device according to one aspect of the present invention, a plurality of the slits that are parallel curved lines are formed on the substrate.

In the electronic device according to one aspect of the present invention, the wiring is formed so as to extend in a direction substantially orthogonal to a gradient vector with respect to a predetermined direction at each point on the predetermined curved surface.

In the electronic device according to one aspect of the present invention, the wiring is formed so as to extend in a direction substantially orthogonal to the gradient vector at a position where magnitude of the gradient vector is large.

In the electronic device according to one aspect of the present invention, on the substrate, a dummy slit is formed in a region where the wiring is not formed.

In the electronic device according to one aspect of the present invention, the substrate is a hollow disk that is bent into a spherical shape.

In the electronic device according to one aspect of the present invention, the devices are arranged at substantially equal intervals such that central angles with respect to a center of the disk are equal.

An electronic component according to one aspect of the present invention includes: an electronic device encapsulated in a silicone elastomer.

A contact lens-type electronic device according to one aspect of the present invention includes: an electronic component sealed and sandwiched from both sides by a lens base material.

A method for manufacturing an electronic device according to one aspect of the present invention includes: a step of forming wiring on a substrate; a step of electrically connecting a plurality of devices to the wiring and placing the devices on the substrate; and a step of forming a slit on the substrate.

According to aspects of the present invention, it is possible to implement an electronic device, an electronic component, a contact lens-type electronic device, and a method for manufacturing an electronic device capable of preventing deterioration in reliability, when a substrate is bent to follow any curved surface.

DESCRIPTION OF EMBODIMENTS

Hereinafter, an electronic device, an electronic component, a contact lens-type electronic device, and a method for manufacturing an electronic device according to aspects of the present invention will be described in detail based on embodiments. However, the present invention is not limited to the embodiments.

Detailed Description of Embodiments of the Invention

Configuration of Electronic Device

Figure 1:
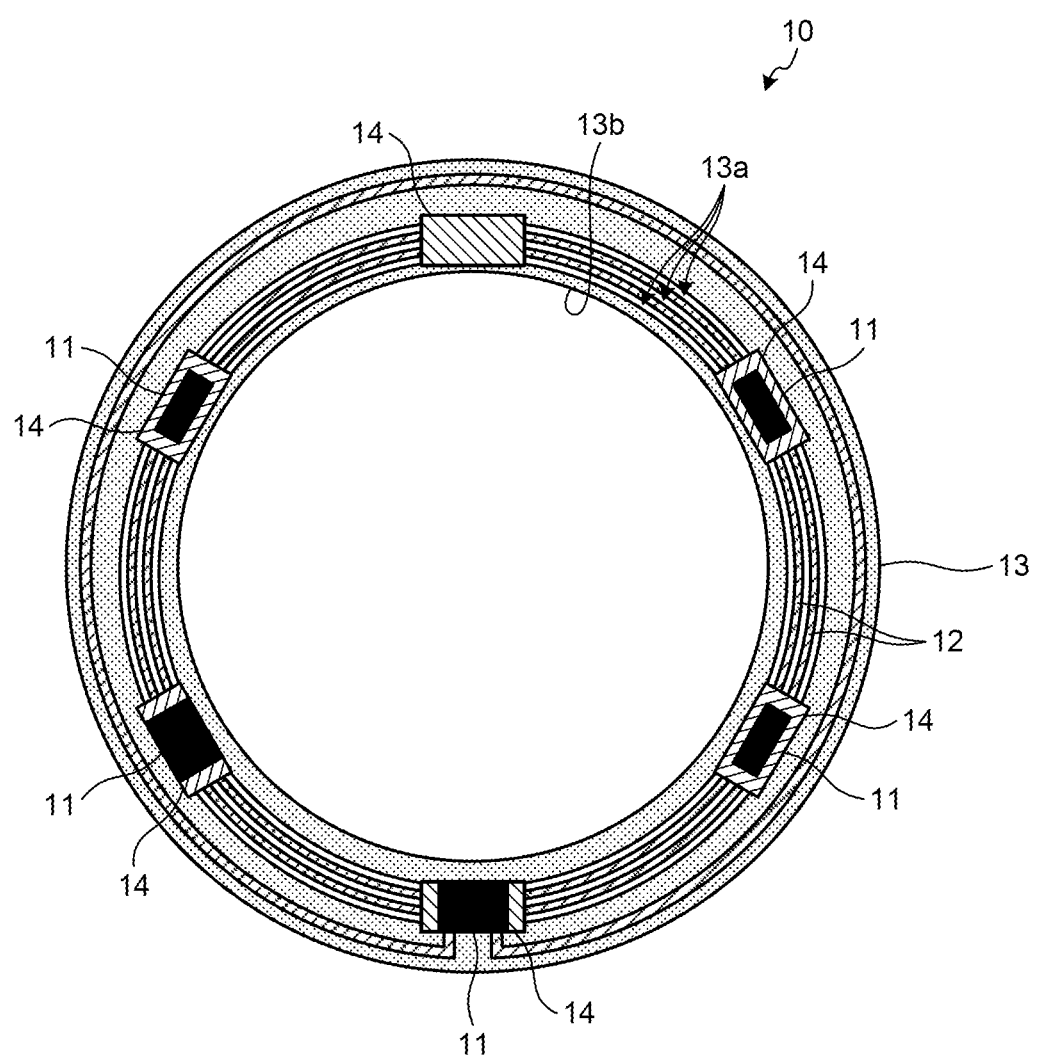
FIG. 1 is a schematic diagram illustrating a configuration of an electronic device according to an embodiment.

FIG. 1 is a schematic diagram illustrating a configuration of an electronic device according to an embodiment. As illustrated in FIG. 1, an electronic device 10 according to the present embodiment includes a plurality of devices 11, wiring 12 that electrically connects each of the devices 11, a substrate 13 on which the wiring 12 is formed and a slit 13a is formed, and a device region 14 that electrically connects the device 11 with the wiring 12.

Although not especially limited, for example, the device 11 is an arithmetic circuit such as a Central Processing Unit (CPU), a storage device such as a memory, a battery capable of storing power, a reception circuit that receives various signals, an output circuit that outputs various signals, and the like. In the disk-shaped electronic device 10, the devices 11 are arranged at substantially equal intervals such that the central angles with respect to the center of the disk are equal.

The wiring 12 is a conductor such as metal or alloy patterned on the substrate 13, and for example, electrical wiring made of copper (Cu) or gold (Au). The wiring 12 is formed so as to extend in a direction substantially orthogonal to the gradient vector with respect to a predetermined direction at each point on a predetermined curved surface. In the electronic device 10, the predetermined direction can be set optionally. However, it is preferable to set the predetermined direction such that the structure of the slit 13a is simplified most. In the present embodiment, the predetermined direction is the optical axis direction of a contact lens-type electronic device, which will be described below.

For example, the substrate 13 is a flexible printed circuit (FPC) substrate made of resin having insulating properties such as polyimide, and is bent to follow a predetermined curved surface. Although not especially limited, for example, the predetermined curved surface is a spherical curved surface (including a spherical surface and an aspherical surface) such as an eyeball. For example, the substrate 13 is a hollow disk bent into a spherical shape. A plurality of the slits 13a that are parallel curved lines parallel to each other, are formed on the substrate 13. Moreover, a circular hollow part 13b is formed in the center of the substrate 13. For example, to prevent the view of a wearer of a contact lens-type electronic device, which will be described below, from being blocked, the diameter of the hollow part 13b is preferably 8 mm or more.

The slit 13a is formed so as to extend in a direction substantially orthogonal to the gradient vector with respect to a predetermined direction at each point on a predetermined curved surface.

The device region 14 is an electrode pad that electrically connects the device 11 with the wiring 12. However, the device 11 and the wiring 12 may also be electrically connected directly, in which case the device region 14 is unnecessary.

Configuration of Electronic Component

Figure 2:
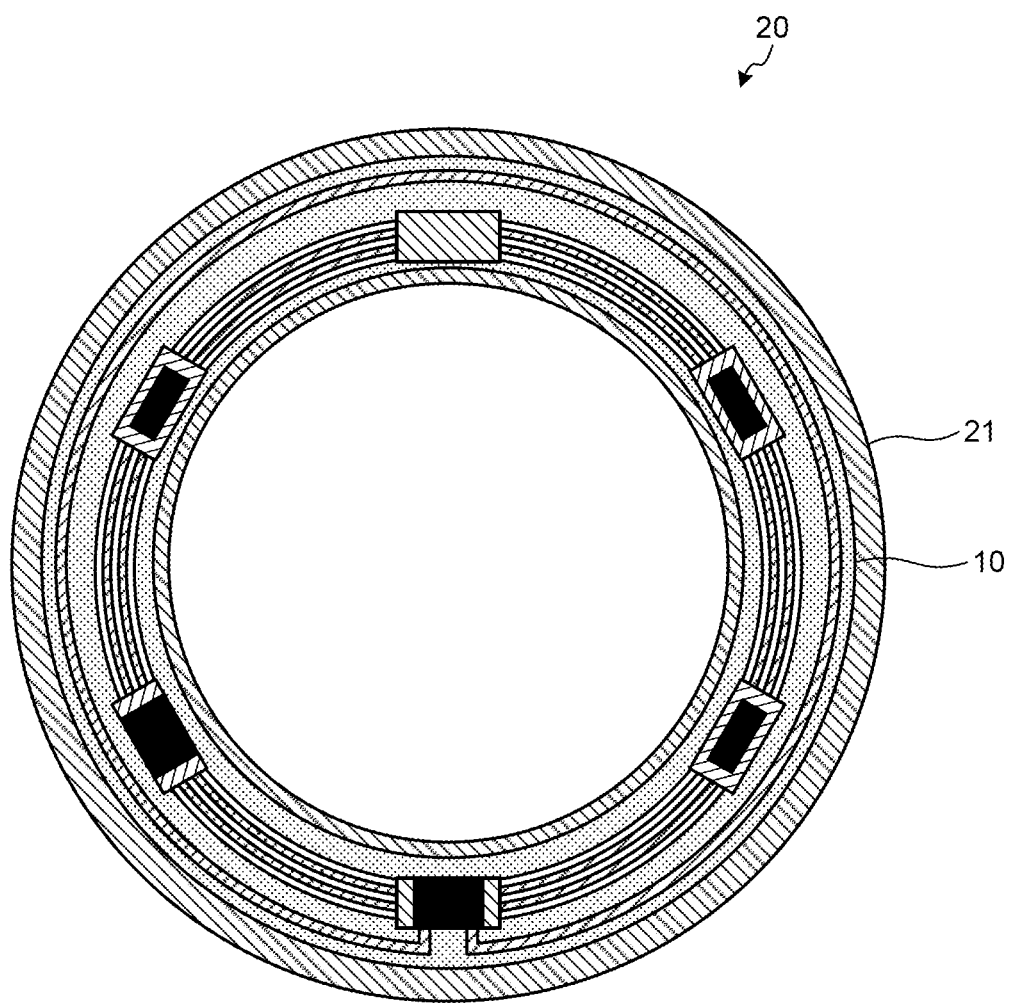
FIG. 2 is a schematic diagram illustrating a configuration of an electronic component using the electronic device illustrated in FIG. 1.

FIG. 2 is a schematic diagram illustrating a configuration of an electronic component using the electronic device illustrated in FIG. 1. As illustrated in FIG. 2, an electronic component 20 is a component in which the electronic device 10 is encapsulated in a silicone elastomer 21. Handling is facilitated by encapsulating the electronic device 10 in the silicone elastomer 21. Moreover, waterproofing is obtained by covering the entire electronic device 10 with the silicone elastomer 21.

Configuration of Contact Lens-Type Electronic Device

Figure 3:
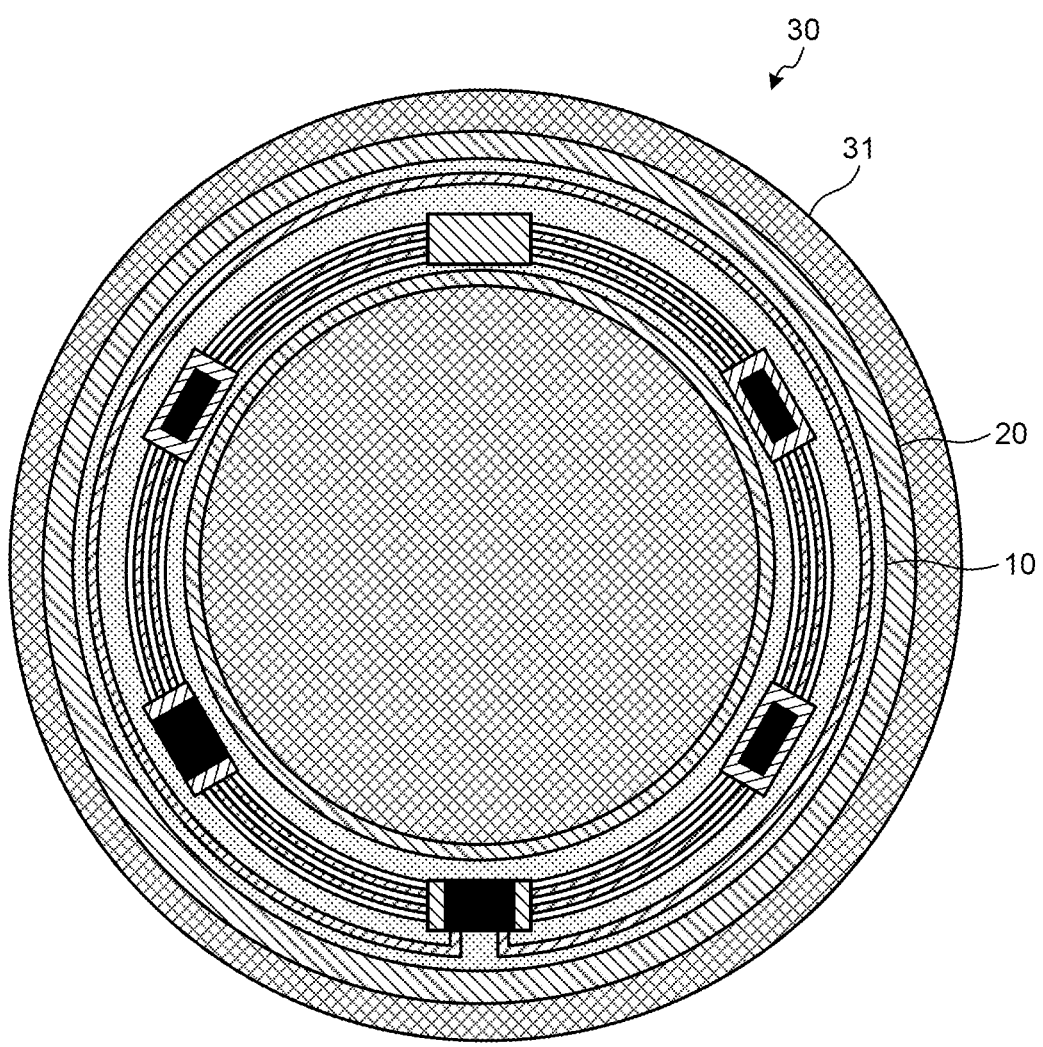
FIG. 3 is a schematic diagram illustrating a configuration of a contact lens-type electronic device using the electronic component illustrated in FIG. 2.

FIG. 3 is a schematic diagram illustrating a configuration of a contact lens-type electronic device using the electronic component illustrated in FIG. 2. As illustrated in FIG. 3, a contact lens-type electronic device 30 includes the electronic component 20 that is sealed and sandwiched from both sides by a lens base material 31. By sealing the electronic component 20 with the lens base material 31, the electronic component 20 can be worn on the eye as a contact lens.

The lens base material 31 is a soft contact lens made of polyhydroxyethyl methacrylate (pHEMA), silicone hydrogel (SHG), and the like. However, the lens base material 31 may also be a hard contact lens.

Modification

Figure 4:
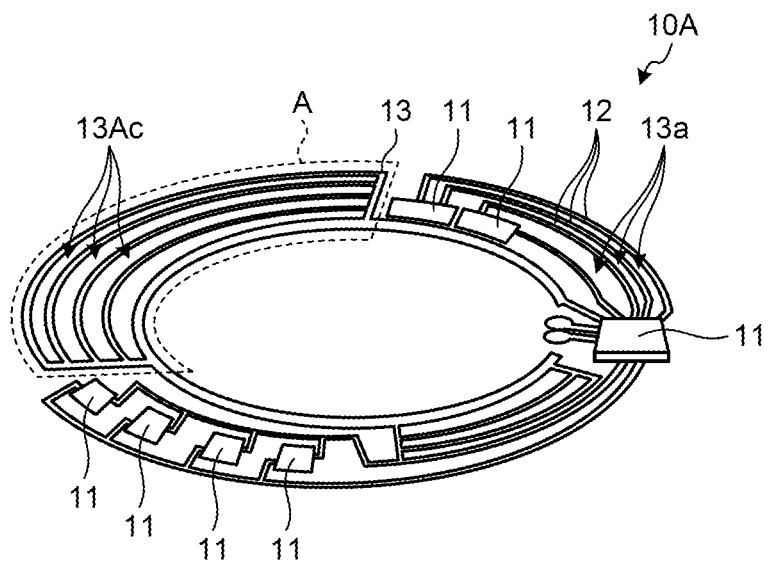
FIG. 4 is a schematic diagram illustrating a configuration of an electronic device according to a modification of the embodiment.

FIG. 4 is a schematic diagram illustrating a configuration of an electronic device according to a modification of the embodiment. As illustrated in FIG. 4, on the substrate 13 of an electronic device 10A, a dummy slit 13Ac is formed in a region A where the wiring 12 is not formed and that is illustrated in broken lines. Because the dummy slit 13Ac is formed, the rigidity of the substrate 13 is reduced, thereby enabling the substrate 13 to follow a curved surface.

Method for Forming Slit

Next, a method for forming the slit 13a will be described. As described above, the slit 13a is preferably formed so as to extend in a direction substantially orthogonal to the gradient vector with respect to a predetermined direction at each point on the predetermined curved surface.

Figure 5:
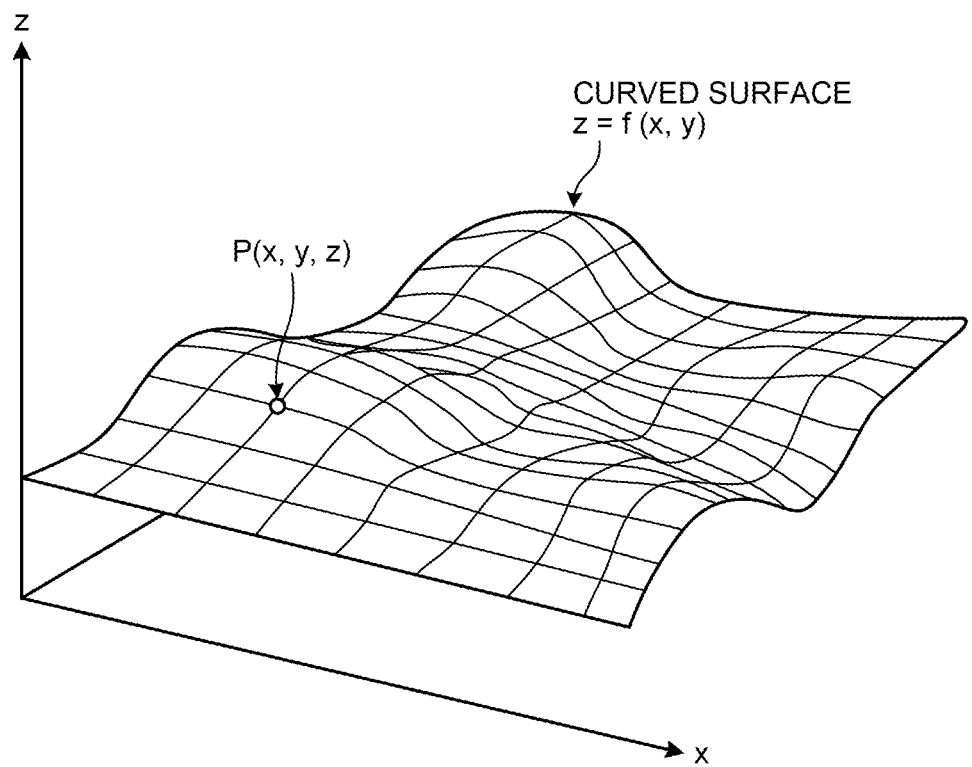
FIG. 5 is a diagram illustrating an example of a curved surface.

FIG. 5 is a diagram illustrating an example of a curved surface. As illustrated in FIG. 5, it is assumed that there is a curved surface represented by z=f(x, y), and that a certain point on the curved surface is a point P (x, y, z).

In this example, the gradient vector at the point P (x, y, z) is represented by $\nabla f(x, y)=(\partial f/\partial x, \partial f/\partial y)$, and the absolute value of the gradient vector $\nabla f$ is increased with an increase in the gradient with respect to the z direction. Moreover, the gradient vector $\nabla f$ is a vector included in a plane perpendicular to the z-axis. The size and direction of the gradient vector $\nabla f$ at each point change according to how the z direction is determined. However, it is preferable to determine the z direction such that the structure of the slit is simplified most.

Figure 6:
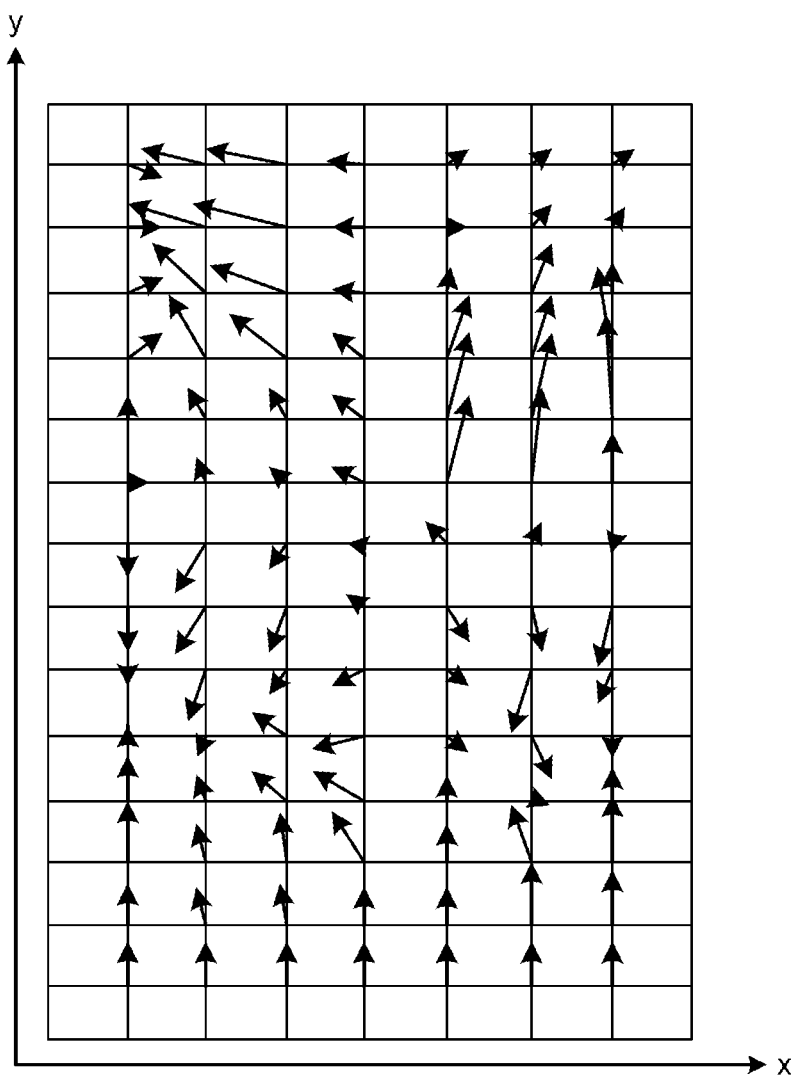
FIG. 6 is a diagram illustrating how gradient vectors of the curved surface are projected onto an xy-plane.

FIG. 6 is a diagram illustrating how gradient vectors of the curved surface are projected onto an xy-plane. FIG. 6 is a diagram in which the gradient vector $\nabla f$ is calculated at each point on the curved surface represented by z=f(x, y), and projected onto the xy-plane. The slit 13a may be formed so as to extend in a direction orthogonal to the gradient vector $\nabla f(x, y)=(\partial f/\partial x, \partial f/\partial y)$ at each point. In other words, the slit 13a is formed so that the gradient vector $\nabla f(x, y)$ and the slit 13a are orthogonal to each other, while the substrate 13 is made to follow the curved surface. In this case, a large number of the slits 13a are preferably formed so as to be substantially orthogonal to the gradient vector $\nabla f$ at a position where the magnitude of the gradient vector $\nabla f(x, y)$, that is, $|\nabla f(x, y)|$ is large (the gradient is steep).

Figure 7:
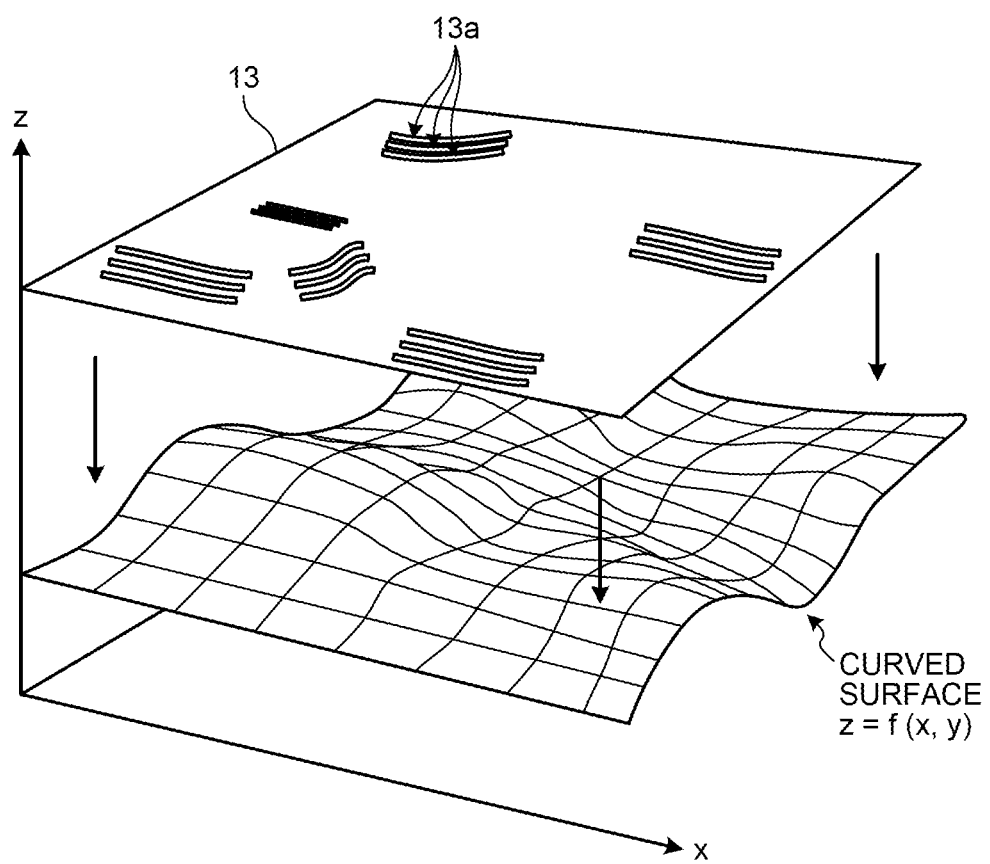
FIG. 7 is a diagram illustrating how slits are formed on a substrate so as to be orthogonal to the gradient vectors.

FIG. 7 is a diagram illustrating how slits are formed on a substrate so as to be orthogonal to the gradient vector. As illustrated in FIG. 7, it is assumed that the slits 13a are formed on the substrate 13. The substrate 13 on which the slits 13a are formed is then made to follow a curved surface. In this manner, the gradient vector $\nabla f(x, y)$ is made orthogonal to the slits 13a.

Figure 8:
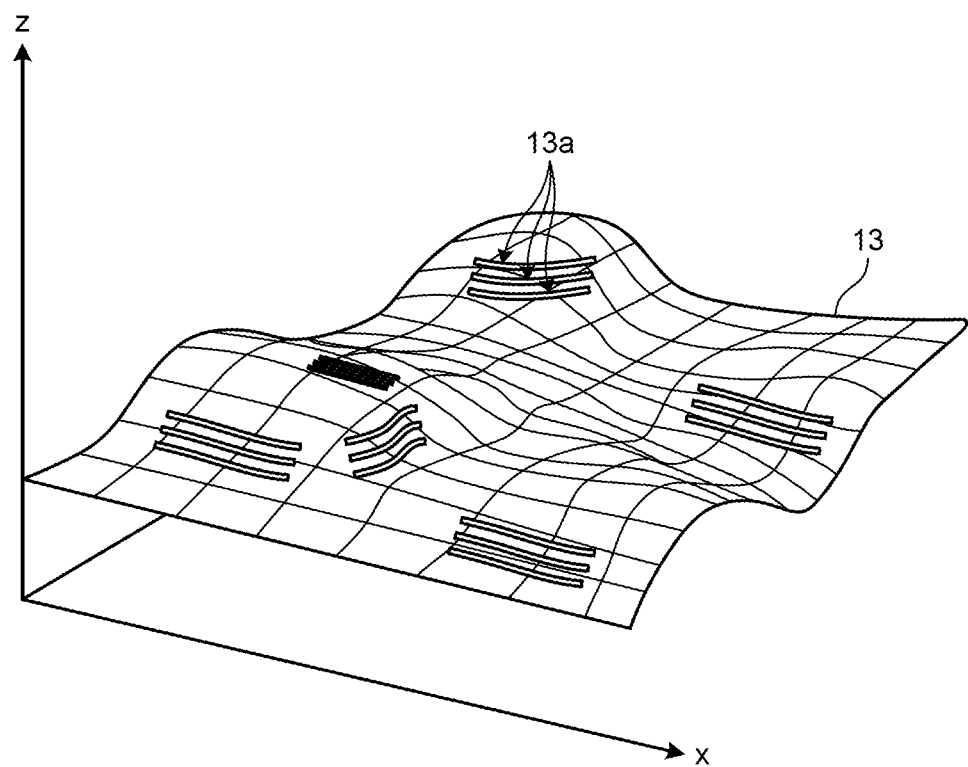
FIG. 8 is a diagram illustrating how a substrate is bent to follow a curved surface.

FIG. 8 is a diagram illustrating how a substrate is bent to follow a curved surface. As illustrated in FIG. 8, when the substrate 13 is bent to follow a curved surface, a pleated structure is harder to be formed when the slits 13a are formed, than when the slits are not formed. In particular, in a direction orthogonal to the gradient vector $\nabla f(x, y)$, a pleated structure is easily formed because a flat substrate 13 is in excess with respect to the curved surface. However, when the gradient vector $\nabla f(x, y)$ and the slit 13a are orthogonal to each other, the slit 13a expands the excess portion of the substrate 13 with respect to the curved surface, thereby effectively suppressing the generation of the pleated structure. As a result, according to the embodiment, it is possible to prevent deterioration in reliability, when the substrate 13 is bent to follow any curved surface.

Next, as an example of causing the substrate to follow a curved surface, an example of making a substrate to follow a part of a cylinder and a circle will be described. However, the curved surface may be any curved surface and is not limited to a cylinder and a circle.

Example of Cylinder

Figure 9:
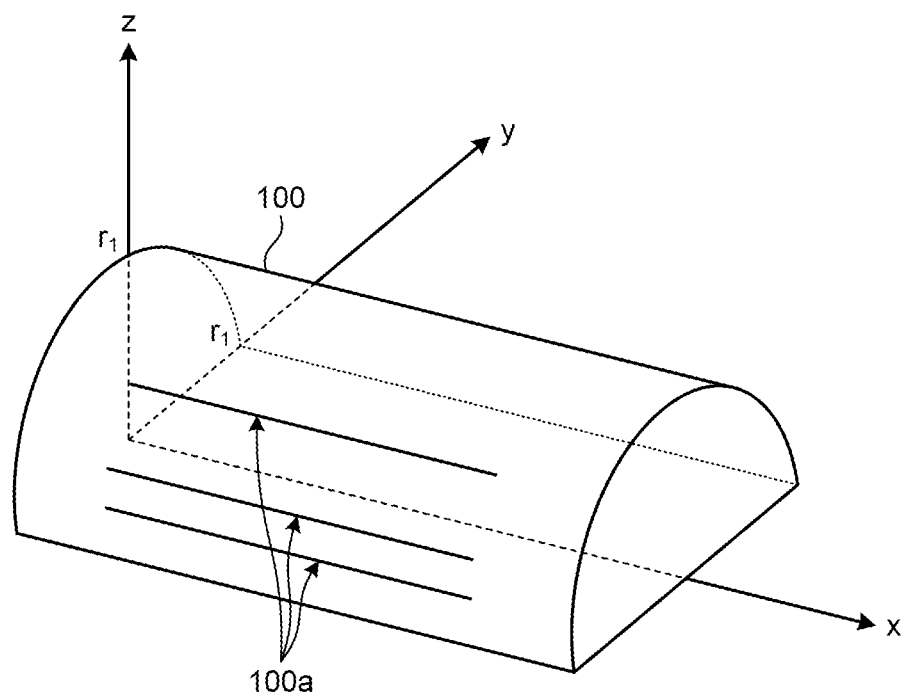
FIG. 9 is a diagram illustrating how a substrate is bent to follow a cylinder.
Figure 10:
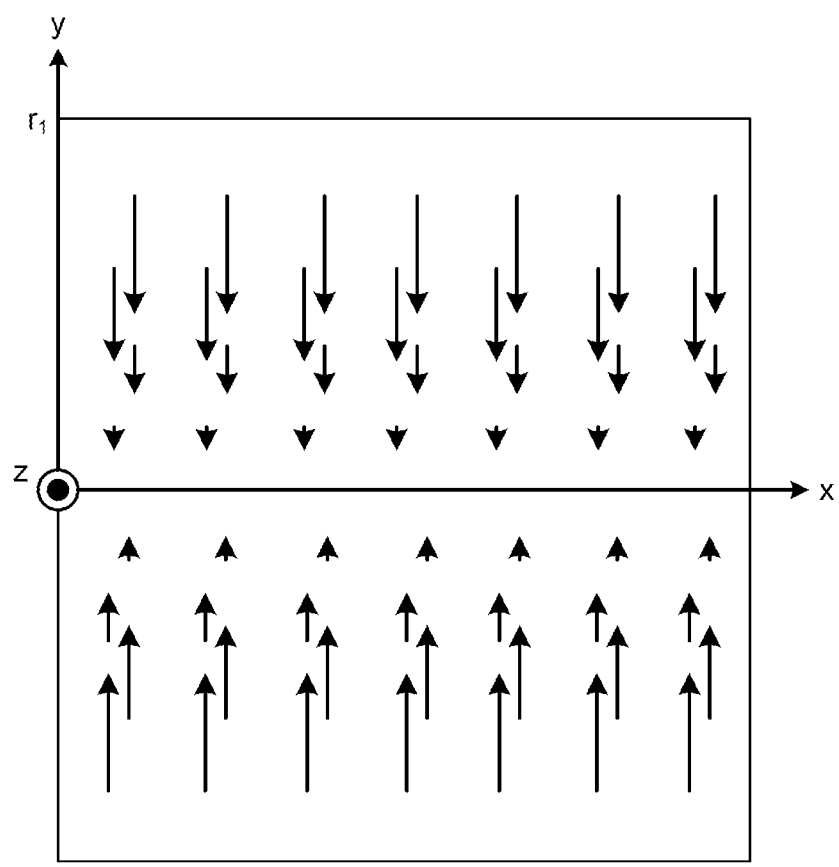
FIG. 10 is a diagram illustrating how the gradient vectors of the cylinder are projected onto an xy-plane.

FIG. 9 is a diagram illustrating how a substrate is bent to follow a cylinder. As illustrated in FIG. 9, it is assumed that a substrate 100 is made to follow a cylinder of radius $r_1$. For a cylinder, the structure of a slit 100a can be simplified most, by setting a direction from the center of a cylinder toward one direction in the outer periphery as a z direction. FIG. 10 is a diagram illustrating how the gradient vectors of a cylinder are projected onto an xy-plane. FIG. 10 is a diagram in which the gradient vector $\nabla f$ is calculated at each point on the cylinder, and projected onto the xy-plane. In this example, the cylinder satisfies $y^2+z^2=r_1^2$. Hence, it is $z=\sqrt{(r_1^2-y^2)}=f(x, y)$. Therefore, it is possible to calculate the gradient vector at each point from $\nabla f=(\partial f/\partial x, \partial f/\partial y)=(0, 2y/\sqrt{(r_1^2-y^2)})$. In the cylinder, the gradient vector $\nabla f$ is increased toward the upper end or the lower end of the cylinder illustrated in FIG. 10. Hence, as illustrated in FIG. 9, the number of slits 100a are preferably increased toward the direction of both side surfaces (directions toward which z is reduced) of the cylinder.

Example of Part of Sphere

Figure 11:
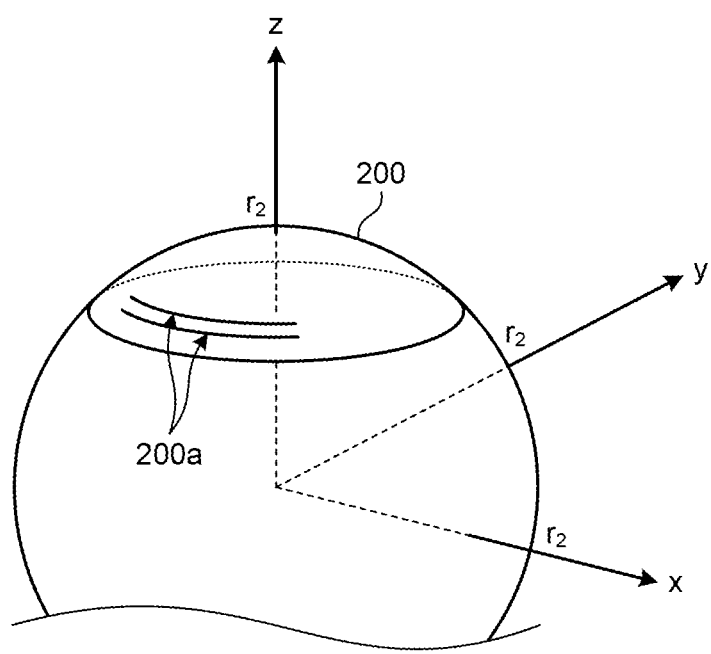
FIG. 11 is a diagram illustrating how a substrate is bent to follow a part of a sphere.
Figure 12:
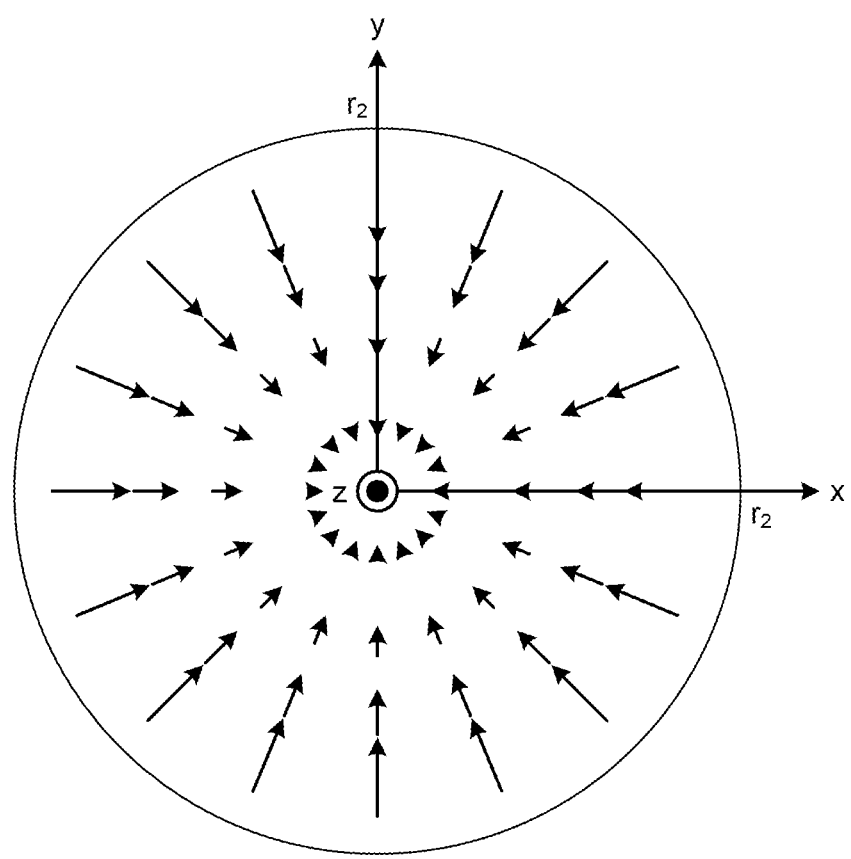
FIG. 12 is a diagram illustrating how the gradient vectors of a part of the sphere are projected onto an xy-plane.

FIG. 11 is a diagram illustrating how a substrate is bent to follow a part of a sphere. As illustrated in FIG. 11, it is assumed that a substrate 200 is made to follow a sphere of radius $r_2$. For a part of a sphere, the structure of a slit 200a can be simplified most, by setting a direction from the center of the sphere toward the apex direction of a part of the sphere formed in a convex shape as a z direction. The z direction is a direction corresponding to the optical axis direction of the contact lens-type electronic device 30. FIG. 12 is a diagram illustrating how the gradient vectors of a part of the sphere are projected onto an xy-plane. FIG. 12 is a diagram in which the gradient vector $\nabla f$ is calculated at each point on a part of the sphere, and projected onto the xy-plane. In this example, because the sphere satisfies $x^2+y^2+z^2=r_2^2$, it is $z=\sqrt{(r_2^2-x^2-y^2)}=f(x, y)$. Therefore, it is possible to calculate the gradient vector at each point from $\nabla f=(\partial f/\partial x, \partial f/\partial y)=(-2x/\sqrt{(r_2^2-x^2-y^2)}, -2y/\sqrt{(r_2^2-x^2-y^2)})\approx(-2x/z, -2y/z)$. In the sphere, the gradient vector $\nabla f$ is increased toward the outer periphery of a circle illustrated in FIG. 12. Hence, as illustrated in FIG. 11, the number of the slits 200a are preferably increased toward the outward direction (direction toward which z is reduced) of the circle.

Figure 13:
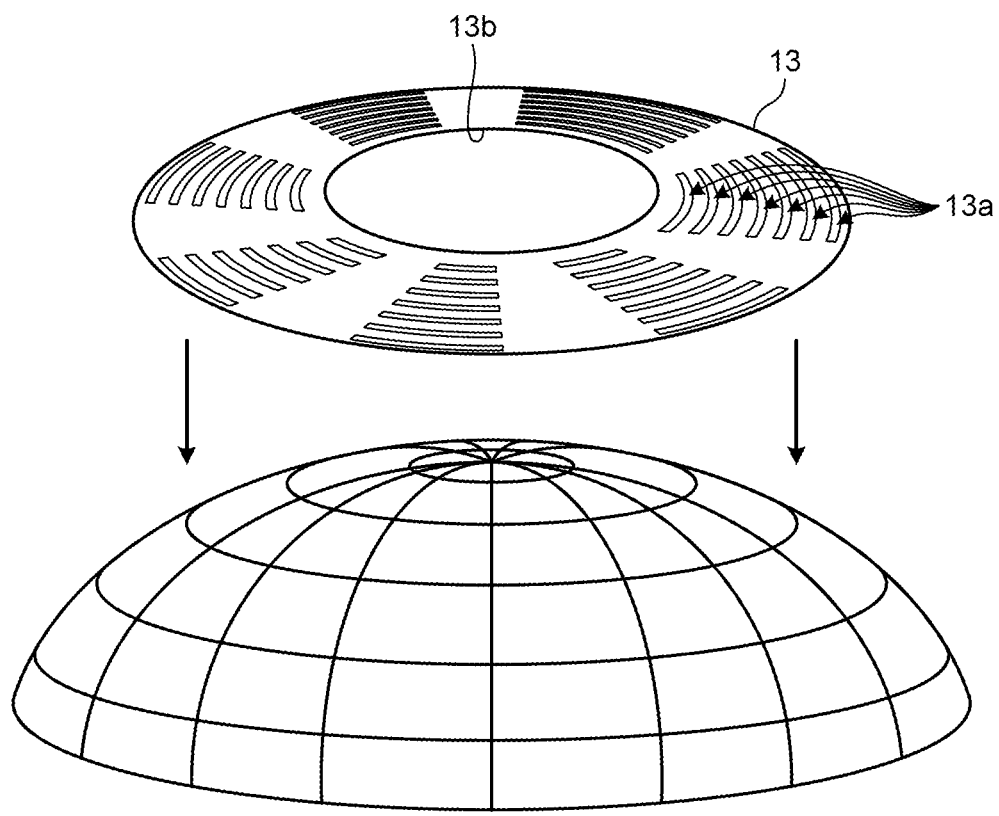
FIG. 13 is a diagram illustrating how slits are formed on a substrate so as to be orthogonal to the gradient vectors, when the curved surface is spherical.

Next, the slits 13a on the substrate 13 will be described. FIG. 13 is a diagram illustrating how slits are formed on the substrate so as to be orthogonal to the gradient vectors, when the curved surface is spherical. As illustrated in FIG. 13, when the curved surface is spherical, the slits 13a that are parallel curved lines are formed concentrically from the center of the disk-shaped substrate 13. In this process, a large number of the slits 13a are preferably formed toward the outside of the substrate 13.

Figure 14:
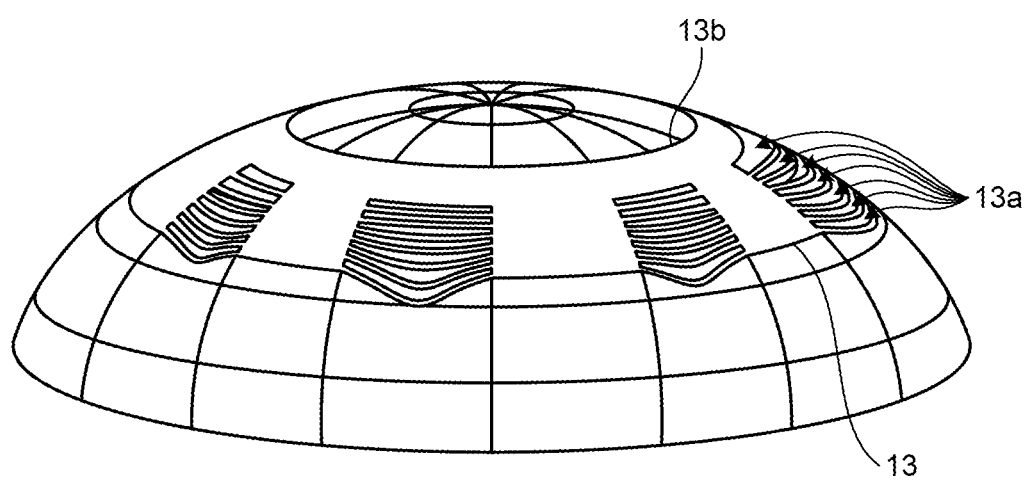
FIG. 14 is a diagram illustrating how a substrate is bent to follow a curved surface, when the curved surface is spherical.

FIG. 14 is a diagram illustrating how a substrate is bent to follow a curved surface, when the curved surface is spherical. As illustrated in FIG. 14, the substrate 13 is in excess with respect to the spherical surface toward the outer periphery of the substrate 13. However, because the excess portion of the slits 13a expand in the outer peripheral direction, the slits 13a prevent a pleated structure from being generated.

Moreover, although the gradient vector $\nabla f(x, y)$ and each of the slits 13a are preferably orthogonal to each other, for example, it is possible to sufficiently prevent the pleated structure from being generated, if the angle between the gradient vector $\nabla f(x, y)$ and the slit 13a is 60 degrees or more.

Furthermore, as a method for preventing the pleated structure, there is also a method of heating and melting a flat substrate, and making the substrate to follow a curved surface. However, because stress concentration is generated at a joint portion between the wiring that follows the curved surface with the substrate and a device that does not bend, the reliability of the electronic device will be deteriorated.

Still furthermore, as a method for preventing the pleated structure, there is a method of joining a device with the substrate formed in a curved shape. However, because highly accurate alignment is required between the substrate and the device, the manufacturing cost will be increased.

Method for Manufacturing Electronic Device

Hereinafter, a method for manufacturing the electronic device 10A illustrated in FIG. 4 will be described.

Figure 15:
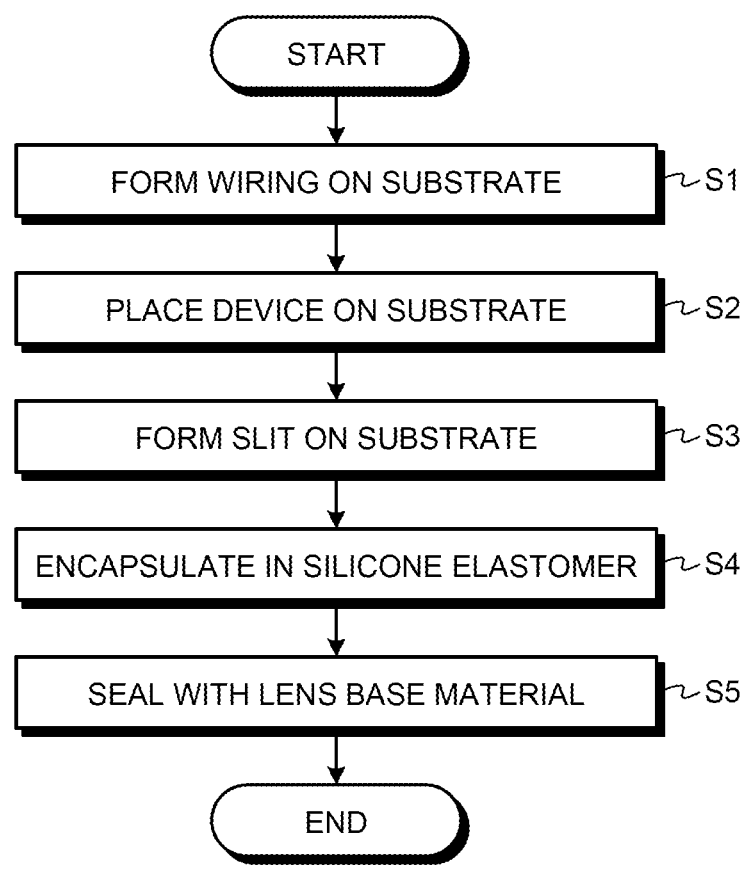
FIG. 15 is a flowchart of a method for manufacturing a contact lens-type electronic device using an electronic device according to a modification of the embodiment.
Figure 16:
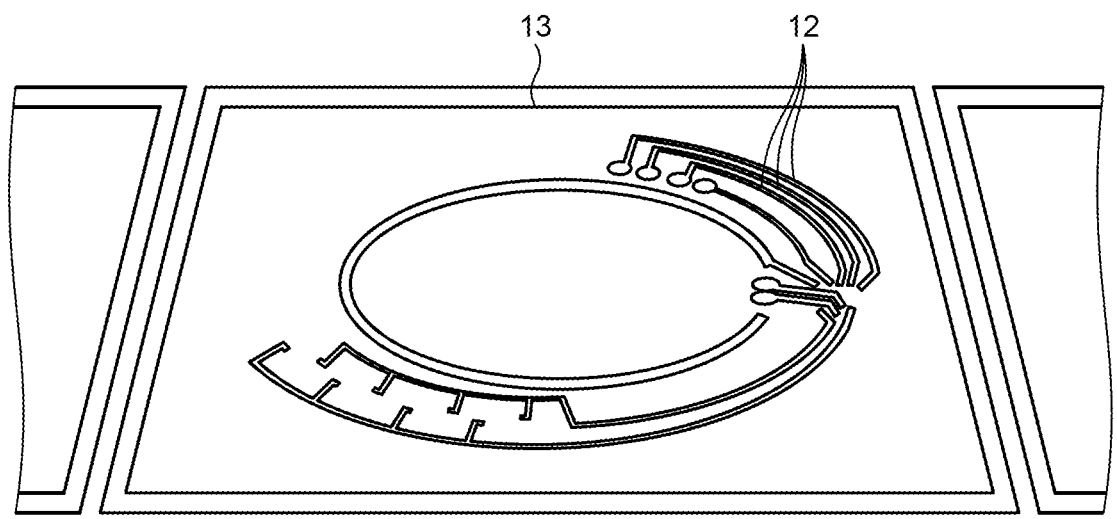
FIG. 16 is a diagram illustrating how wiring is formed on a substrate.

FIG. 15 is a flowchart of a method for manufacturing a contact lens-type electronic device using an electronic device according to a modification of the embodiment. As illustrated in FIG. 15, first, the wiring 12 is formed on the substrate 13 (step S1). FIG. 16 is a diagram illustrating how wiring is formed on a substrate. As illustrated in FIG. 16, wiring made of conductive metal or alloy is formed on a flat substrate 13.

Figure 17:
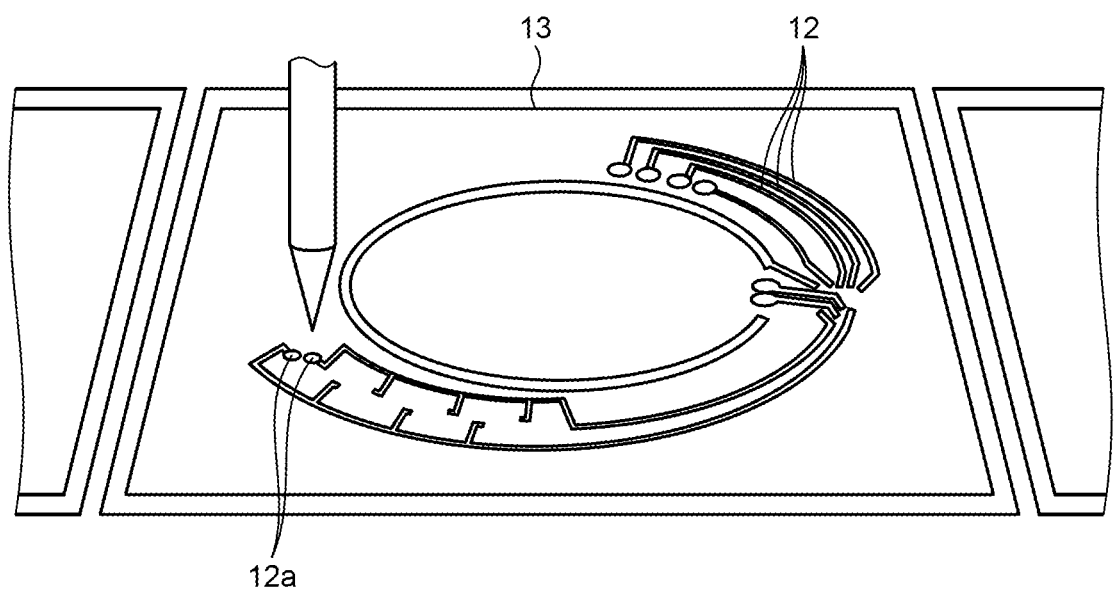
FIG. 17 is a diagram illustrating how adhesive is applied to the wiring.
Figure 18:
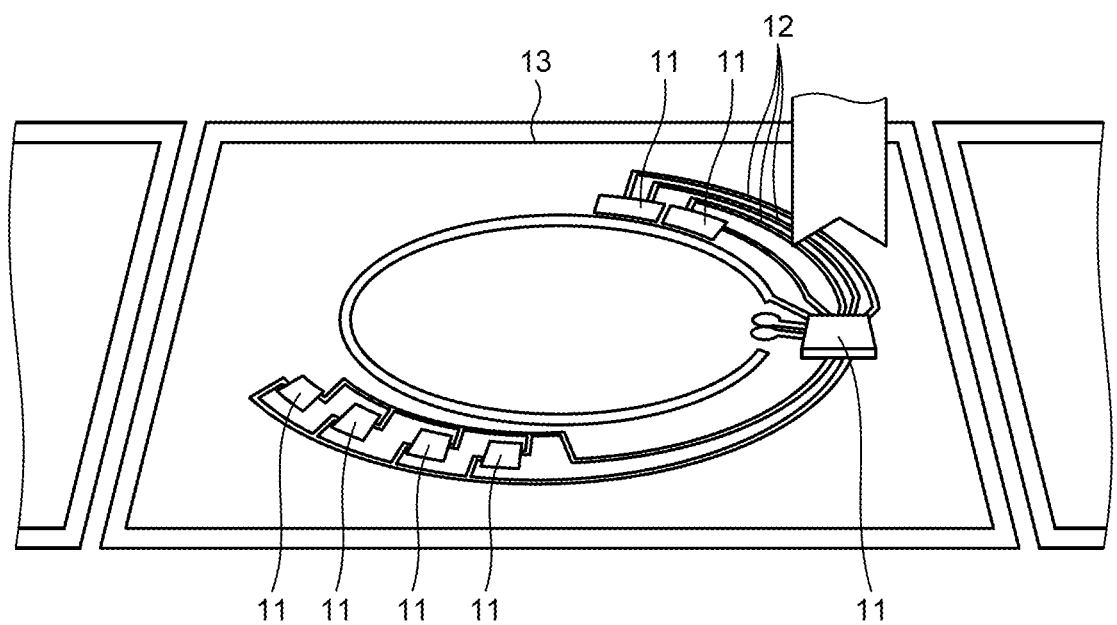
FIG. 18 is a diagram illustrating how a device is placed on a substrate.

Subsequently, the device 11 is placed on the substrate 13 (step S2). In this process, the device 11 and the wiring 12 are electrically connected to each other. FIG. 17 is a diagram illustrating how adhesive is applied to the wiring. As illustrated in FIG. 17, a conductive adhesive is applied on the wiring 12. FIG. 18 is a diagram illustrating how a device is placed on a substrate. As illustrated in FIG. 18, by placing the device 11 on the applied adhesive, each device 11 and the wiring 12 are electrically connected to each other, and the device 11 is placed on the substrate 13.

Figure 19:
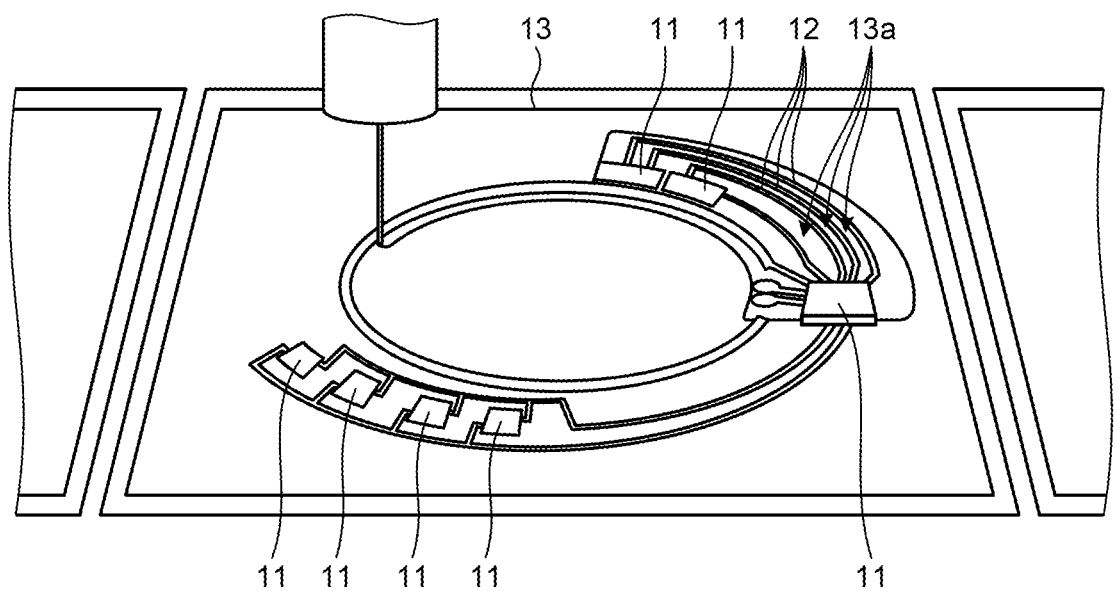
FIG. 19 is a diagram illustrating how slits are formed on a substrate.
Figure 20:
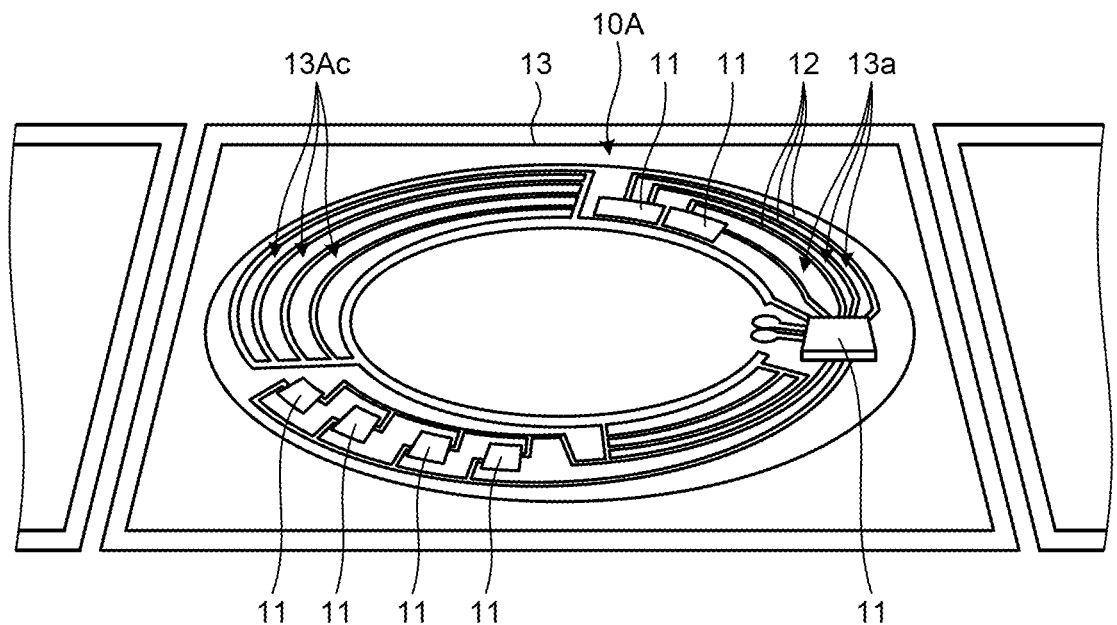
FIG. 20 is a diagram illustrating a state where slits are formed on a substrate.

Then, the slit 13a is formed on the substrate 13 (step S3). FIG. 19 is a diagram illustrating how slits are formed on the substrate. As illustrated in FIG. 19, the substrate 13 is cut with a laser to form the slit 13a on the substrate 13. FIG. 20 is a diagram illustrating a state where slits are formed on the substrate. As illustrated in FIG. 20, the dummy slit 13Ac is also formed on the substrate 13 with a laser to form the electronic device 10A illustrated in FIG. 4.

Method for Manufacturing Electronic Component and Contact Lens-Type Electronic Device Hereinafter, a method for manufacturing the electronic component 20 and the contact lens-type electronic device 30 using the electronic device 10A will be described.

Figure 21:
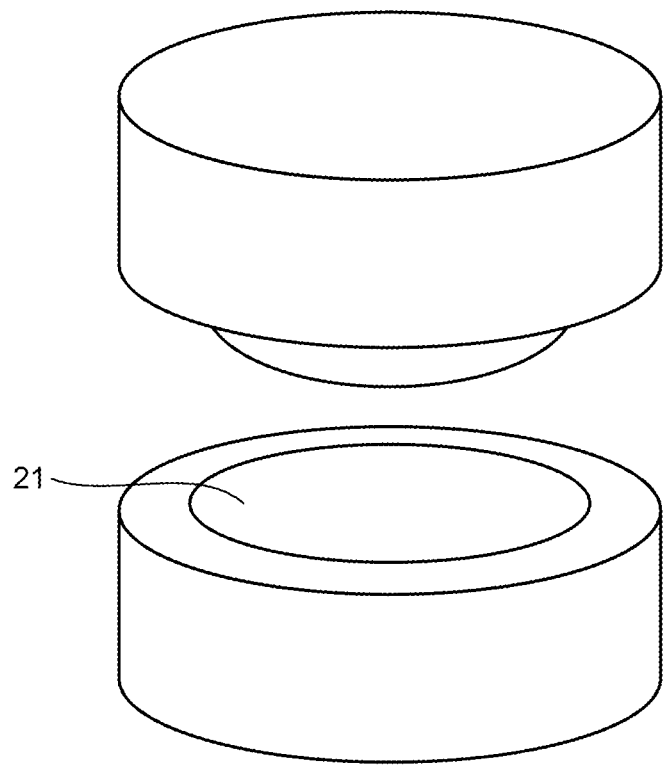
FIG. 21 is a diagram illustrating a silicone mold.

FIG. 21 is a diagram illustrating a silicone mold. As illustrated in FIG. 21, a pair of silicone molds in which silicone elastomer is applied to the spherical curved surface is prepared.

Figure 22:
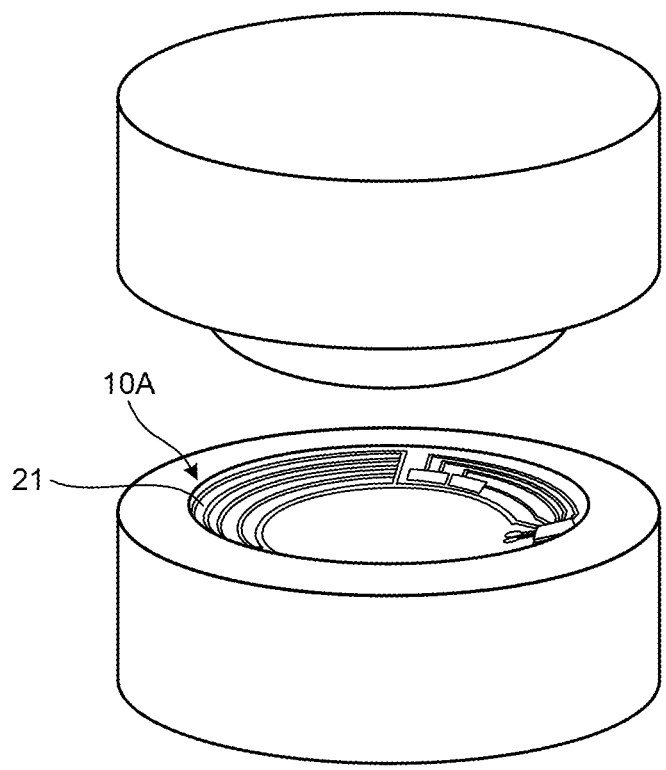
FIG. 22 is a diagram illustrating how an electronic device is placed on a silicone elastomer.

FIG. 22 is a diagram illustrating how an electronic device is placed on a silicone elastomer. As illustrated in FIG. 22, the electronic device 10A is placed on the silicone elastomer applied to the lower silicone mold.

Figure 23:
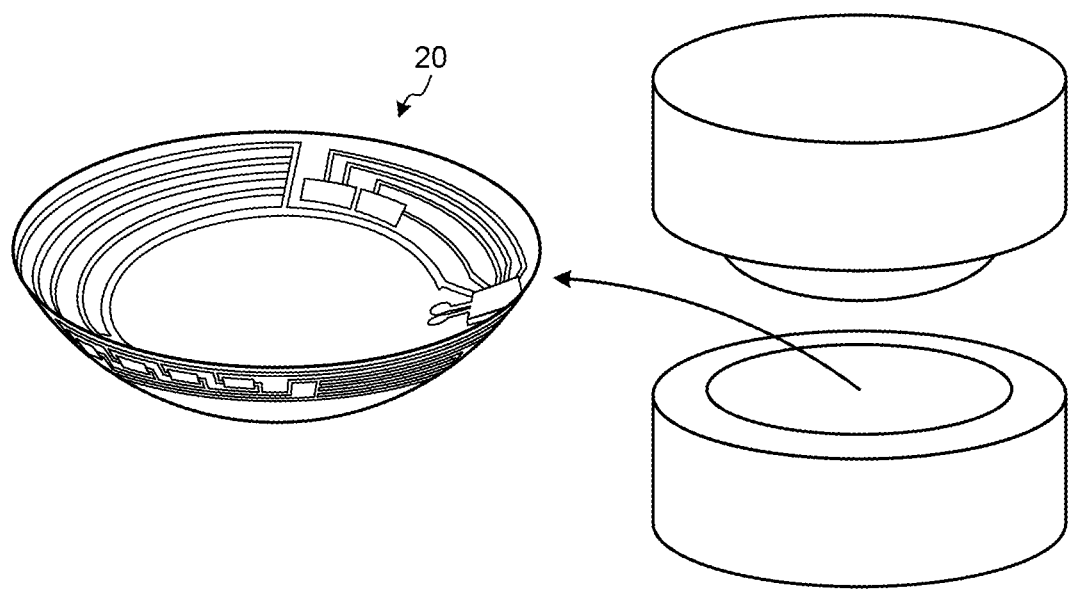
FIG. 23 is a diagram illustrating how an electronic device is encapsulated in a silicone elastomer.

FIG. 23 is a diagram illustrating how an electronic device is encapsulated in a silicone elastomer. As illustrated in FIG. 23, the electronic device 10A is encapsulated in the silicone elastomer 21 by the silicone mold (step S4). As a result, the electronic component 20 is manufactured.

Then, the electronic component 20 is sealed and sandwiched from both sides by the lens base material 31 (step S5). As a result, the contact lens-type electronic device 30 is manufactured.

REFERENCE SIGNS LIST 10, 10A electronic device
11 device
12 wiring
13, 100, 200 substrate
13a, 100a, 200a slit
13b hollow part
13Ac dummy slit
14 device region
20 electronic component
21 silicone elastomer
30 contact lens-type electronic device
31 lens base material

The invention claimed is:

1. An electronic device, comprising:
 a plurality of devices;
 wiring electrically connecting each of the devices; and
 a substrate on which the wiring is formed and a plurality of slits are formed, wherein
 the substrate is a hollow disk that is bent into a spherical shape,
 the plurality of slits are formed concentrically around a vertex of the spherical shape,
 the plurality of slits include an inner slit and an outer slit which are adjacent in a direction away from the vertex, and
 the entire inner slit overlaps with the outer slit in the direction away from the vertex.

2. The electronic device according to claim 1, wherein the substrate is bent to follow a predetermined curved surface.

3. The electronic device according to claim 2, wherein the plurality of slits are formed so as to extend in a direction substantially orthogonal to a gradient vector with respect to a predetermined direction at each point on the predetermined curved surface.

4. The electronic device according to claim 3, wherein the plurality of slits are formed so as to extend in a direction substantially orthogonal to the gradient vector at a position where magnitude of the gradient vector is large.

5. The electronic device according to claim 3, wherein the plurality of the slits that are parallel curved lines are formed on the substrate.

6. The electronic device according to claim 2, wherein the wiring is formed so as to extend in a direction substantially orthogonal to a gradient vector with respect to a predetermined direction at each point on the predetermined curved surface.

7. The electronic device according to claim 6, wherein the wiring is formed so as to extend in a direction substantially orthogonal to the gradient vector at a position where magnitude of the gradient vector is large.

8. The electronic device according to claim 1, wherein on the substrate, a plurality of dummy slits are formed in a region where the wiring is not formed, and the plurality of dummy slits are formed concentrically around the vertex of the spherical shape.

9. The electronic device according to claim 8, wherein
 the plurality of dummy slits include an inner dummy slit and an outer dummy slit which are adjacent in the direction away from the vertex, and
 the entire dummy inner slit overlaps with the outer dummy slit in the direction away from the vertex.

10. The electronic device according to claim 8, wherein
 the region has portions extending in the direction away from the vertex, and
 the plurality of dummy slits are arranged between the portions.

11. The electronic device according to claim 1, wherein the devices are arranged at substantially equal intervals such that central angles with respect to a center of the disk are equal.

12. An electronic component, comprising: the electronic device according to claim 1 encapsulated in a silicone elastomer.

13. A contact lens-type electronic device, comprising:
 the electronic component according to claim 12 sealed and sandwiched from both sides by a lens base material.

14. The electronic device according to claim 1, wherein
the substrate has portions extending in the direction away from the vertex, and
the plurality of slits are arranged between the portions.

15. A method for manufacturing an electronic device, comprising:
forming wiring on a substrate that is a hollow disk;
electrically connecting a plurality of devices to the wiring and placing the plurality of devices on the substrate; and
forming a plurality of slits concentrically around a center of the disk on the substrate including an inner slit and an outer slit which are adjacent in a direction away from the vertex, such that the entire inner slit overlaps with the outer slit in the direction away from the vertex.

* * * * *